United States Patent [19]

Nakamura

[11] Patent Number: 5,006,732

[45] Date of Patent: Apr. 9, 1991

[54] SEMICONDUCTOR CIRCUIT HAVING BUFFER FUNCTION

[75] Inventor: Hiroyuki Nakamura, Isehara, Japan

[73] Assignee: Canon Kabushiki Kaisha, Tokyo, Japan

[21] Appl. No.: 354,757

[22] Filed: May 22, 1989

[30] Foreign Application Priority Data

May 25, 1988 [JP] Japan .................. 63-125950

[51] Int. Cl.[5] .................................... H03K 19/00
[52] U.S. Cl. ..................... 307/473; 307/446; 307/570
[58] Field of Search ............... 307/270, 443, 446, 451, 307/473, 570, 578, 579

[56] References Cited

U.S. PATENT DOCUMENTS

| 4,542,331 | 9/1985 | Boyer | 307/446 |
| 4,697,109 | 9/1987 | Honma et al. | 307/446 |
| 4,810,903 | 3/1989 | Bushey et al. | 307/570 |
| 4,845,386 | 7/1989 | Ueno | 307/446 |

OTHER PUBLICATIONS

IBM Tech. Disc., Milham, Tri-State Buffer, Dec. '82, p. 3496.
IBM Tech. Disc. Bulletin, Kraft-Lowden & Stinston, Tri-State Driver Utilizing Bi-Polar-Complementary Metal-Oxide Semiconductor Technology, Jan. '74, p. 2677.

Primary Examiner—Stanley D. Miller
Assistant Examiner—T. Cunningham
Attorney, Agent, or Firm—Fitzpatrick, Cella, Harper & Scinto

[57] ABSTRACT

A semiconductor circuit is provided which has a buffer function, and in which impedance of an output terminal can be set to a high value for a power supply. In another aspect, a semiconductor circuit is provided having an input switching function and in which the scale of the circuit is not excessively large. In both aspects, electric power consumption is small.

5 Claims, 3 Drawing Sheets

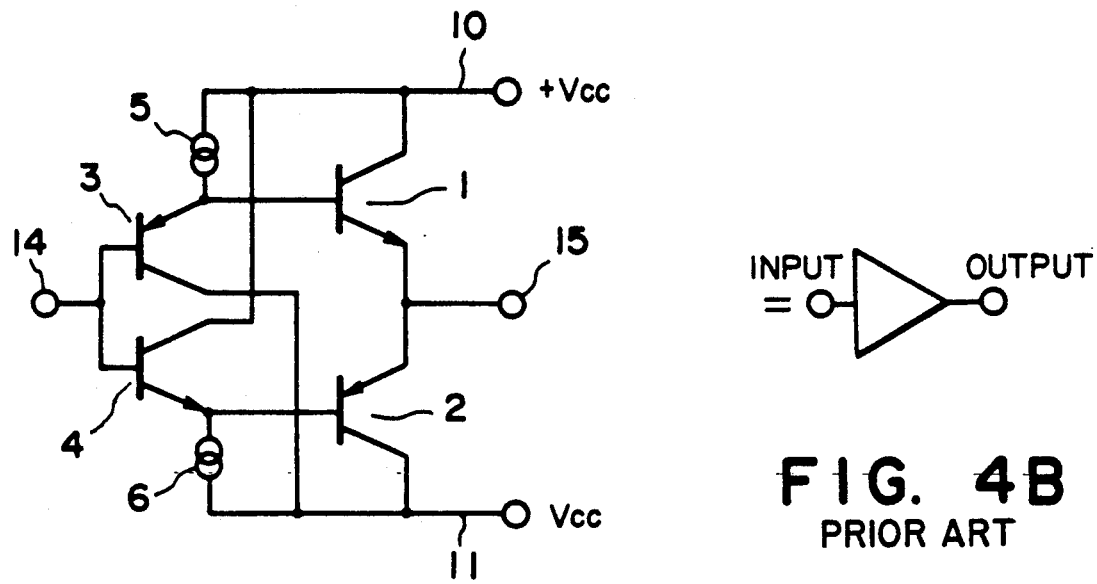
FIG. 4A
PRIOR ART
FIG. 4B
PRIOR ART
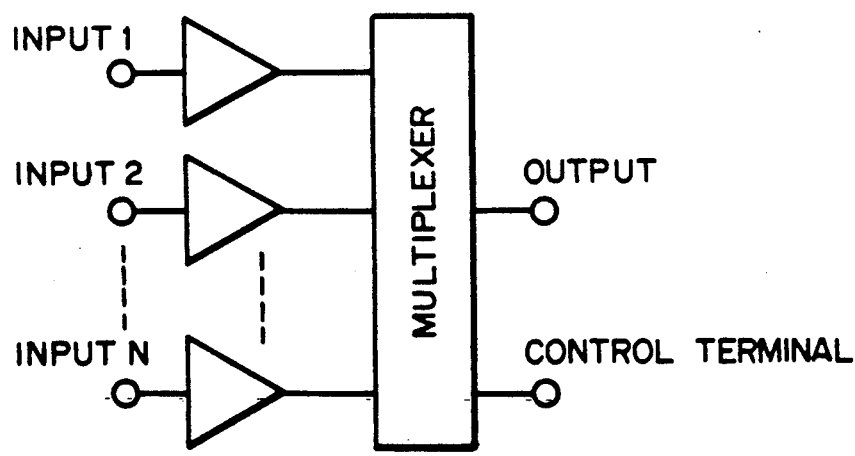
FIG. 5
PRIOR ART

SEMICONDUCTOR CIRCUIT HAVING BUFFER FUNCTION

BACKGROUND OF THE INVENTION

1. Field of the Invention

The present invention relates to a semiconductor circuit having a buffer function.

2. Related Background Art

Hitherto, a semiconductor integrated circuit using a Bi-CMOS process has been constructed as shown in FIG. 4A.

In the diagram, reference numerals 1 to 4 denote bipolar type transistors, 5 and 6 indicate constant current devices comprising MOS FETs, and 10 and 11 represent lines connected to one terminal of a power supply. When an input 14 is at the high level, the transistor 3 is turned off and the transistor 4 is turned on, so that the transistor 1 is turned on and the transistor 2 is turned off and the output is set to the high level. When the input is at the low level, the transistor 3 is turned on and the transistor 4 is turned off, so that the transistor 1 is turned off and the transistor 2 is turned on and the output is set to the low level.

As mentioned above, the circuit of FIG. 4A functions as a buffer as shown in FIG. 4B.

Therefore, for instance, as shown in FIG. 5, when a plurality of circuits of FIG. 4A are used to switch input signals, a multiplexer to select one of a plurality of buffer circuits is further necessary, so that the circuit scale enlarges and the electric power consumption increases. Further, there is a problem such that the electric power is consumed even in the other buffers which are not selected by the multiplexer.

SUMMARY OF THE INVENTION

It is an object of the present invention to provide a semiconductor circuit having a buffer function which can eliminate the foregoing drawbacks.

Another object of the invention is to provide a semiconductor circuit having a buffer function in which an impedance of an output terminal can be set to a high value for a power supply and an electric power consumption can be reduced.

Still another object of the invention is to provide a semiconductor circuit having an input switching function in which a circuit scale is not so large and an electric power consumption is small.

The above and other objects and features of the present invention will become apparent from the following detailed description and the appended claims with reference to the accompanying drawings.

BRIEF DESCRIPTION OF THE DRAWINGS

FIGS. 4A and 4B are circuit diagrams of a conventional example; and

FIG. 5 is an explanatory diagram of a conventional example.

DETAILED DESCRIPTION OF THE PREFERRED EMBODIMENTS

An embodiment of the present invention will be described hereinbelow.

Figure 1:
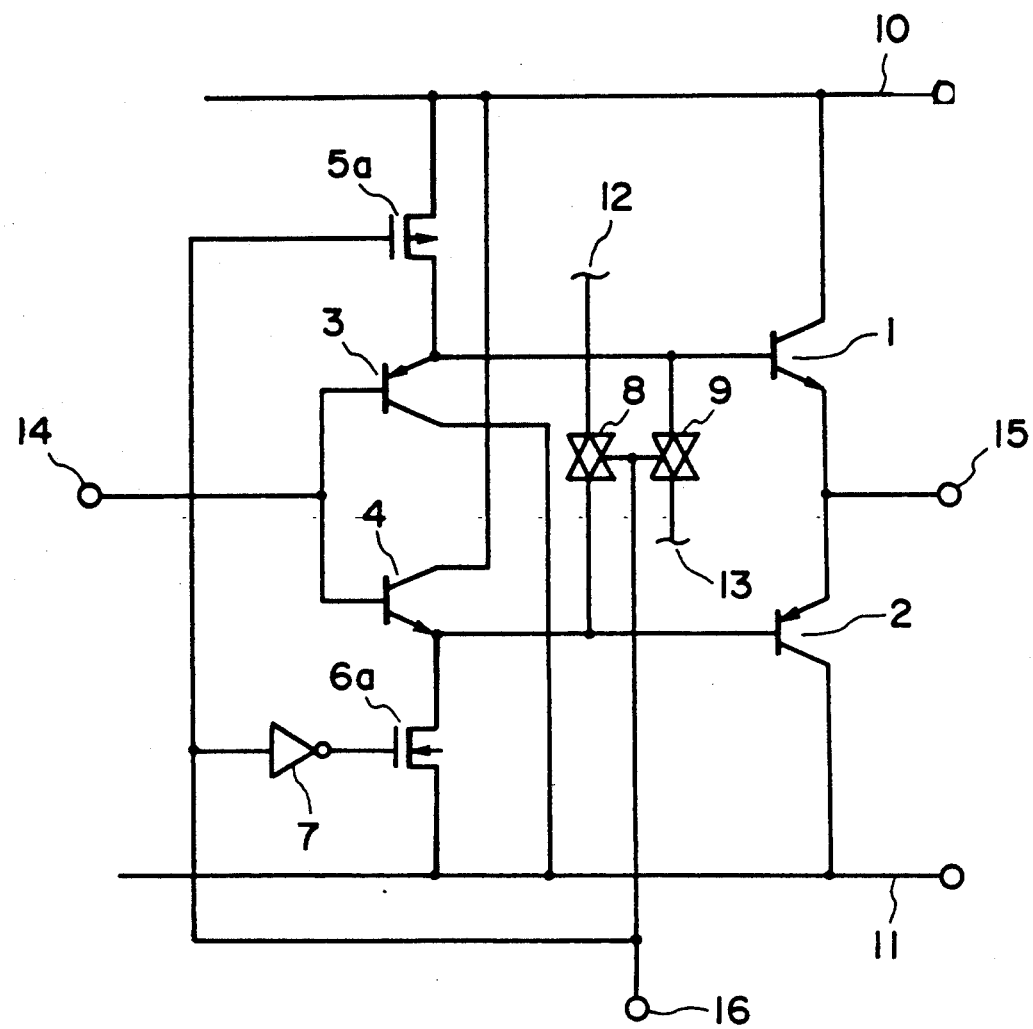
FIG. 1 is a circuit diagram of an embodiment of the present invention.

FIG. 1 is a circuit diagram showing a semiconductor circuit as an embodiment of the invention.

Figure 2:
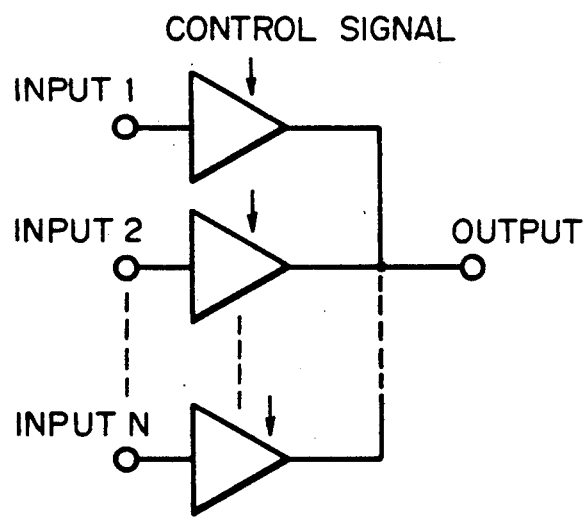
FIG. 2 is a circuit diagram of an example of the application of the invention.

FIG. 2 is a circuit diagram showing an example of the application of the circuit of FIG. 1. The same parts and components as those shown in FIG. 4A are designated by the same reference numerals.

In the diagrams, reference numerals 1 and 2 denote the NPN type and PNP type transistors at the output stage; 3 and 4 indicate the PNP type and NPN type transistors at the input stage; 5a a P channel MOS FET; 6a an N channel MOS FET; 7 an inverter; 8 and 9 transmission gates; 10 one terminal of a power supply and indicates the plus (+) side; 11 the other terminal of the power supply and indicates the minus (−) side; 14 the input terminal to input a signal; 15 the output terminal to output a signal; and 16 a control terminal to input a control signal to control the signal output from the output terminal 15. The MOS FETs 5a and 6a function as the switchable current source devices. The transmission gates 8 and 9 function as the analog switches. A line 12 is connected to the (+) side 10 of the power supply and a line 13 is connected to the (−) side 11 of the power supply.

In the above construction, when the control signal which is input to the control terminal 16 is set to the low level, the transistors 5a and 6a are turned on, thereby supplying a current that does not significantly change when control terminal 16 is set to the low level. The analog switches 8 and 9 are turned off and do not influence the operation of the circuit. Therefore, when the control signal is at the low level, the circuit of FIG. 1 also functions as a buffer similarly to the circuit of FIG. 4A.

On the other hand, when the control signal is set to the high level, the PMOS FET 5a is turned off since a voltage which is applied to its gate is a threshold voltage or less. The NMOS FET 6a is turned off since the low level signal is applied through the inverter 7 to its gate and a voltage which is applied to the gate is likewise a threshold voltage or less. The analog switches 8 and 9 are simultaneously turned on. Therefore, all of the transistors 1 to 4 are turned off and the output terminal 15 is set to the high impedance for any of the (+) side 10 and (−) side 11 of the power supply and the electric power consumption can be substantially set to 0.

By constructing as shown in FIG. 2 by using a plurality of circuits shown in FIG. 1 as buffers and connecting their output terminals one another, the input switching function similar to that of the circuit of FIG. 5 can be accomplished.

That is, when the low level control signal is supplied to the buffer circuit regarding the selected one of the inputs 1 to N and the high level control signal is given to the other buffer circuits, only the input of the buffer circuit applied with the low level control signal is selected and is output from the output terminal.

Since all of the transistors in the buffer circuit to which the high level control signal was given are turned off, the output terminal is set to the high impedance and no influence is exerted on the other circuits. The electric power consumption becomes almost zero.

Therefore, there is no need to use the multiplexer or the like as shown in FIG. 5. The simple wired connection can be executed the circuit scale can be reduced, and the electric power consumption can be decreased.

The control signal which is given to each buffer circuit is output from a microcomputer or a hardware circuit comprising a counter, a decoder, and the like.

Figure 3A:
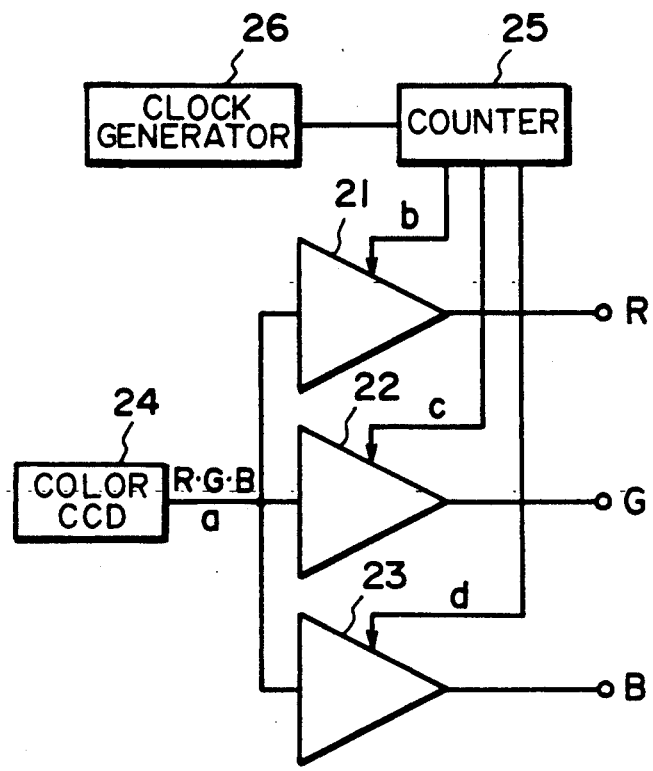
FIG. 3A is a circuit diagram for separating a color image into R, G, and B signals.
Figure 3B:
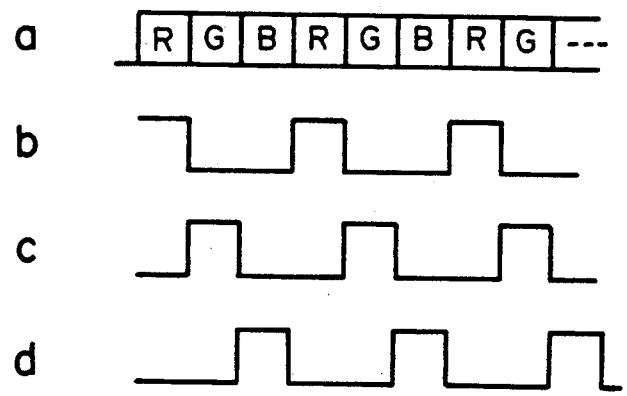
FIG. 3B is a diagram showing a signal in each section in FIG. 3A.

FIG. 3 shows a practical use example of the circuit of FIG. 1. FIG. 3A is a diagram showing a circuit for reading a color image and separating into red, green, and blue signals and for outputting. FIG. 3B is a diagram showing the signal in each section in FIG. 3A. Reference numerals 21 to 23 denote buffer circuits shown in FIG. 1; 24 indicates a color CCD to read a color image; 25 a ternary counter; and 26 a clock generator to supply a clock to the counter 25. Color signals a are sequentially output from the color CCD 24 in accordance with the order of R, G, B, R, G, B, ... and input to the buffer circuits 21 to 23, respectively. Control signals b, c, and d are output from the counter 25 to the control terminals of the buffer circuits 21 to 23 in accordance with this order synchronously with the color signals a. When the counter 25 counts one clock which is generated from the clock generator, the counter 25 outputs the signal b. When two clocks are counted, the counter outputs the signal c. When three clocks are counted, the counter outputs the signal d. When the counter further counts one clock, the counter again outputs the signal a. In this manner, the above operation is repeated.

By the above operation, the buffer circuits 21, 22, and 23 are repetitively made operative and nonoperative in accordance with the order. The R signal is output from the buffer circuit 21, the G signal is output from the buffer circuit 22, and the B signal is output from the buffer circuit 23.

The circuit of the function and operation which are similar to those in the embodiment can be also obtained even if the bipolar type transistors 1 to 4, MOS FETs 5a and 6a, and transmission gates 8 and 9 in the above embodiment are constructed as the opposite conductivity type and the polarity of the power supply is set to the opposite polarity. It will be obviously understood from the circuit construction that the similar function and operation are also obtained by a modified form of the circuit which controls only by the MOS FETs 5a and 6a without using the transmission gates 8 and 9 or the circuit which controls only by the transmission gates 8 and 9 and in which the MOS FETs 5a and 6a are used as the simple constant current devices.

As described above, although the circuit functions as the buffer, the output terminal can be set to the high impedance for the power supply and the electric power consumption can be reduced. Thus, since the circuits can be switched without using a multiplexer, the circuit scale can be reduced and the electric power consumptions of the other circuits than the desired circuit can be set to almost zero. Therefore, the whole electric power consumption can be reduced.

The present invention is not limited to the foregoing embodiment but many modifications and variations are possible within the spirit and scope of the appended claims of the invention.

I claim:

1. A semiconductor circuit having a buffer function comprising:
   an input terminal for inputting a signal;
   an output terminal for outputting a signal corresponding to the signal input by the input terminal;
   a control signal input terminal for inputting a control signal to control whether said signal corresponding to the signal input by said input terminal is output from said output terminal or not;
   a first transistor whose collector is connected to one terminal of a power supply and whose emitter is connected to an emitter of a second transistor and whose base is connected to an emitter of a third transistor;
   a collector of the second transistor is connected to another terminal of the power supply and the base of the second transistor is connected to an emitter of a fourth transistor;
   a first current device in which one of terminals is connected to the one terminal of the power supply and the other terminal is connected to the emitter of the third transistor and which is turned on or off by said control signal;
   a collector of the third transistor is connected to the other terminal of the power supply;
   a collector of the fourth transistor is connected to the one terminal of the power supply and the emitter of the fourth transistor is connected to one of a pair of terminals of a second current device;
   the other terminal of the second current device is connected to the other terminal of the power supply;
   the second current source is turned on or off by said control signal;
   wherein said input terminal is connected to bases of the third and fourth transistors and said output terminal is connected to the emitters of the first and second transistors.

2. A semiconductor circuit according to claim 1, further having:
   a first analog switch which is connected between the base of the second transistor and the one terminal of the power supply and is turned on or off by said control signal; and
   a second analog switch which is connected between the base of the first transistor and the other terminal of the power supply and is turned on or off by said control signal.

3. A semiconductor circuit having an input switching function comprising:
   (A) a plurality of buffer circuits; each of said plurality of buffer circuits having
   (a) an input terminal for inputting a signal;
   (b) an output terminal for outputting a signal corresponding to the signal input by the input terminal;
   (c) a control signal input terminal for inputting a control signal to control whether said signal corresponding to the signal input by said input terminal is output from said output terminal or not;
   (d) a first transistor whose collector is connected to one terminal of a power supply and whose emitter is connected to an emitter of a second transistor and whose base is connected to emitter of a third transistor;
   (e) a collector of the second transistor is connected to another terminal of the power supply and the base of the second transistor is connected to an emitter of a fourth transistor;
   (f) a first current device in which one of terminals is connected to the one terminal of the power supply and the other terminal is connected to the emitter of the third transistor and which is turned on or off by said control signal;

(g) a collector of the third transistor is connected to the other terminal of the power supply;

(h) a collector of the fourth transistor is connected to the one terminal of the power supply and the emitter of the fourth transistor is connected to one of a pair of terminals of a second current device, (i) the other terminal of the second current device is connected to the other terminal of the power supply;

(j) the second current source is turned on or off by said control signal;

(k) wherein said input terminal is connected to bases of the third and fourth transistors and said output terminal is connected to the emitters of the first and second transistors; and (B) means for supplying the control signals to said control signal input terminals, wherein said supplying means makes one of said plurality of buffer circuits operative.

4. A semiconductor circuit according to claim 3, further having means for supplying color image signals to the input terminals of said plurality of buffer circuits.

5. A semiconductor circuit according to claim 3, wherein said supplying means is a counter.

* * * * *

UNITED STATES PATENT AND TRADEMARK OFFICE
CERTIFICATE OF CORRECTION

PATENT NO. : 5,006,732
DATED : April 9, 1991
INVENTOR(S) : HIROYUKI NAKAMURA ET AL.

It is certified that error appears in the above-identified patent and that said Letters Patent is hereby corrected as shown below: ON THE TITLE PAGE:

AT [56] REFERENCES CITED

Other Publications, "Milham," should read --Millham,";
"Stinston," should read --Stinson,--;
and "Bi-Polar" should read --Bipolar--.

COLUMN 2

Line 53, "terminals one" should read
--terminals with one--.

COLUMN 4

Line 58, "to emitter" should read --to an emitter--.

COLUMN 6

Line 2, Close up right margin.

Signed and Sealed this

Twelfth Day of January, 1993

Attest:

DOUGLAS B. COMER

*Attesting Officer*     Acting Commissioner of Patents and Trademarks